United States Patent
Wang et al.

(10) Patent No.: US 10,510,972 B2
(45) Date of Patent: Dec. 17, 2019

(54) OLED DISPLAY PANEL AND A DISPLAY DEVICE COMPRISING THE SAME

(71) Applicant: SHANGHAI TIANMA AM-OLED CO., LTD., Shanghai (CN)

(72) Inventors: Xiangcheng Wang, Shanghai (CN); Yuji Hamada, Shanghai (CN); Jinghua Niu, Shanghai (CN); Chen Liu, Shanghai (CN)

(73) Assignee: SHANGHAI TIANMA AM-OLED CO., LTD., Shanghai (CN)

(*) Notice: Subject to any disclaimer, the term of this patent is extended or adjusted under 35 U.S.C. 154(b) by 180 days.

(21) Appl. No.: 15/713,504

(22) Filed: Sep. 22, 2017

(65) Prior Publication Data
US 2018/0013087 A1  Jan. 11, 2018

(30) Foreign Application Priority Data
Mar. 9, 2017 (CN) .......................... 2017 1 0140136

(51) Int. Cl.
*H01L 51/50* (2006.01)
*H01L 51/00* (2006.01)
*H01L 51/52* (2006.01)

(52) U.S. Cl.
CPC ........ *H01L 51/5004* (2013.01); *H01L 51/005* (2013.01); *H01L 51/006* (2013.01); *H01L 51/0058* (2013.01); *H01L 51/0059* (2013.01); *H01L 51/0061* (2013.01); *H01L 51/0072* (2013.01); *H01L 51/0074* (2013.01); *H01L 51/506* (2013.01); *H01L 51/5012* (2013.01); *H01L 51/5064* (2013.01); *H01L 51/5072* (2013.01); *H01L 51/0054* (2013.01); *H01L 51/5076* (2013.01); *H01L 51/5234* (2013.01)

(58) Field of Classification Search
CPC .............. H01L 51/5076; H01L 51/005; H01L 51/5004; H01L 51/5012; H01L 51/5064; H01L 51/506; H01L 51/5072; H01L 51/0059; H01L 51/0054; H01L 51/0072; H01L 51/0061; H01L 51/0058; H01L 51/006; H01L 51/5234
See application file for complete search history.

(56) References Cited

U.S. PATENT DOCUMENTS

2006/0007212 A1* 1/2006 Kimura ................ G09G 3/3258
    345/204
2016/0104855 A1* 4/2016 Ohsawa ............. H01L 51/5012
    257/40

FOREIGN PATENT DOCUMENTS

| CN | 105418486 A | 3/2016 |
|---|---|---|
| CN | 106206974 A | 12/2016 |
| WO | 2016/116504 A1 | 7/2016 |
| WO | 2016/116528 A1 | 7/2016 |

* cited by examiner

*Primary Examiner* — Gregory D Clark
(74) *Attorney, Agent, or Firm* — Alston & Bird LLP

(57) ABSTRACT

The present disclosure relates to an OLED display panel. With the OLED display panel, a higher luminous efficiency is achieved by selecting a thermally activated delayed fluorescent material for doping into an organic light emitting layer and applying a compound having a specific energy level to match, thereby the luminous efficiency of an organic photo electronic device is improved.

25 Claims, 3 Drawing Sheets

OLED DISPLAY PANEL AND A DISPLAY DEVICE COMPRISING THE SAME

CROSS-REFERENCE TO RELATED APPLICATIONS

The application claims the benefit of the earlier filing date of Chinese Patent Application No. CN201710140136.6, filed on Mar. 9, 2017 to the State Intellectual Property Office, the contents of which are incorporated by reference herein in its entirety.

TECHNICAL FIELD

The present disclosure relates to the field of organic electroluminescent materials, and specifically to an OLED display panel and a display device comprising the same, and in particular to a combination of a light emitting layer material and its application in an organic electroluminescent device.

BACKGROUND

At present, an organic electroluminescent device is generally composed of an anode, an organic layer and a cathode, wherein, at least one layer of the organic layer has luminescence function, and generally the light emitting layer of an OLED device is required to emit lights with three wavelengths, i.e. a blue light (B), a green light (G) and a red light (R). Generally, the blue light emitting material may be fluorescence emitting material, TTA light emitting material, or phosphorescence emitting material; the green light emitting material is a phosphorescence emitting material; and the red light emitting material is a phosphorescence emitting material. The luminescence mechanism of fluorescence is the use of singlet excitons accounting for 25% of the total excitons generated after the carrier recombination; the luminescence mechanism of TTA is the generation of a singlet exciton from two triplet excitons, which uses 62.5% of the total excitons; and the luminescence mechanism of phosphorescence is the use of singlet excitons and triplet excitons generated after the carrier recombination.

When the blue light emitting material is a fluorescence emitting material, the dopant is mainly perylene derivatives, oxadiazole derivatives, and anthracene derivatives, singlet excitons accounting for 25% of the total excitons are utilized, and the maximum external quantum yield is not more than 5%, thereby causing too high power consumption and waste of energy. When the blue light emitting material is a TTA material, host material in the light emitting layer is mainly used to complete the triplet-triplet annihilation process for luminescence, 62.5% of the total excitons generated are utilized and such ratio is higher than that of the fluorescence, but theoretically 100% utilization of the generated excitons cannot be achieved, thereby causing waste of energy. When the blue light emitting material is a phosphorescence emitting material, the dopant is mainly organic complexes of heavy metals such as iridium, platinum, and ruthenium, theoretically 100% utilization of the generated excitons can be achieved, however, due to the longer lifetime of the triplet exciton, there will appear a state that the concentration of exciton is too high which will induce the quenching among the excitons, thereby causing energy inactivation and thus the lifetime of the device is shorter.

In 2011, Professor Adachi, et al. from Kyushu University, Japan, reported a thermally activated delayed fluorescent (TADF) material with good luminous performance. The energy gap between state $S_1$ and state $T_1$ of such material is smaller and the lifetime of the exciton in state $T_1$ is longer. Under certain temperature conditions, the exciton in state $T_1$ can realize the process of $T_1 \rightarrow S_1$ by reverse intersystem crossing (RISC), and then experience radiation attenuation from state $S_1$ to ground state $S_0$. Therefore, luminous efficiency of the OLED device using such material as the light emitting layer can be comparable to that of the phosphorescence emitting material, and with no need for a rare metal element, thereby reducing the material cost.

There is still a need in the art to develop a method for improving the efficiency of a blue light organic electroluminescent device by using a thermally activated delayed fluorescent (TADF) material, and to provide an efficient and stable method for making an organic electroluminescent device.

SUMMARY

The first object of the present disclosure is to provide an OLED display panel, which comprises a first electrode and a second electrode, at least one light emitting layer disposed between the first electrode and the second electrode, a first functional layer and a second functional layer disposed on both sides of each light emitting layer respectively; the first functional layer comprises at least one compound having a hole transport capability; and the second functional layer comprises at least one compound having an electron transport capability;

in the light emitting layer, the organic light emitting compound in the light emitting layer is doped with a thermally activated delayed fluorescent material;

wherein the lowest triplet energy level of the organic light emitting compound ($T_H$) is higher than the lowest singlet energy level of the thermally activated delayed fluorescent material ($S_T$);

wherein the lowest triplet energy level of the compound having a hole transport capability ($T_1$) and the lowest triplet energy level of the organic light emitting compound ($T_H$) satisfy formula (I):

$$T_1 - T_H > -0.2 \text{ eV} \qquad \text{formula (I);}$$

wherein the lowest triplet energy level of the compound having an electron transport capability ($T_2$) and the lowest triplet energy level of the organic light emitting compound ($T_H$) satisfy the formula (II):

$$T_2 - T_H > -0.2 \text{ eV} \qquad \text{formula (II).}$$

The second object of the present disclosure is to provide a display device comprising the OLED display panel as described in the first object of the present disclosure.

Compared with the prior art, the present disclosure has the following benefits:

a higher luminous efficiency is achieved by selecting a thermally activated delayed fluorescent material for doping into an organic light emitting layer and applying a compound having a specific energy level to match, thereby the luminous efficiency of an organic photoelectronic device is improved.

DETAILED DESCRIPTION

For the purpose of understanding the present disclosure, the following examples are listed below in the present disclosure. It will be apparent to those skilled in the art that the examples are merely illustrations of the present disclosure and should not be construed as specific limitations to the present disclosure.

Figure 1:
FIG. 1 is a cross-sectional structural representation of an OLED display panel provided in a specific embodiment of the present disclosure.

In a specific embodiment of the present disclosure, referring to FIG. 1, an OLED display panel is provided, which comprises a first electrode 101 and a second electrode 102, at least one light emitting layer 103 disposed between the first electrode 101 and the second electrode 102; a first functional layer 104 and a second functional layer 105 disposed on both sides of each light emitting layer 103 respectively; the first functional layer 104 comprises at least one compound having a hole transport capability; and the second functional layer 105 comprises at least one compound having an electron transport capability; in the at least one light emitting layer, an organic light emitting compound in at least one of the light emitting layer 103 is doped with a thermally activated delayed fluorescent material; the lowest triplet energy level of the organic light emitting compound ($T_H$) is higher than the lowest singlet energy level of the thermally activated delayed fluorescent material ($S_T$); the lowest triplet energy level of the compound having a hole transport capability ($T_1$) and the lowest triplet energy level of the organic light emitting compound ($T_H$) satisfy formula (I):

$$T_1 - T_H > -0.2 \text{ eV} \qquad \text{formula (I);}$$

the lowest triplet energy level of the compound having an electron transport capability ($T_2$) and the lowest triplet energy level of the organic light emitting compound ($T_H$) satisfy the formula (II):

$$T_2 - T_H > -0.2 \text{ eV} \qquad \text{formula (II).}$$

It should be noted that the OLED display panel according to the present disclosure may further comprise a plurality of light emitting layers, and FIG. 1 is an example in which only one light emitting layer is exemplarily illustrated. When a plurality of light emitting layers are included, a first functional layer and a second functional layer are disposed on both sides of each of the light emitting layer, respectively.

The thermally activated delayed fluorescent (TADF) material is a material in which the excited triplet exciton can be converted to the singlet state by reverse intersystem crossing at room temperature when the energy gap between the triplet state and the singlet state is small. When a TADF material is used in the blue light emitting layer, it is possible to provide a blue light organic electroluminescent device with a theoretical quantum efficiency of 100% and capable of converting a triplet excitation energy into fluorescence. TADF material is directly used as a dopant material, and the luminescence process is achieved by radiative transition of the generated singlet exciton to the ground state. The TADF material transfers the energy of the generated singlet exciton to the ordinary fluorescent dopant material, and the dopant material emits fluorescence through the radiative transition.

In a preferred specific embodiment, the at least one light emitting layer includes at least a blue light emitting layer; the blue light emitting layer includes at least one high energy state organic light emitting compound and a thermally activated delayed fluorescent material doped therein; in the blue light emitting layer, the lowest singlet energy level of the high energy state organic light emitting compound is higher than the lowest singlet energy level of the thermally activated delayed fluorescent material.

When the light emitting layer is doped with a thermally activated delayed fluorescent material, an organic compound with high energy state is selected as the host material, and the luminescence manner further includes the transition from the triplet state to the singlet state of the thermally activated delayed fluorescent material in addition to the transition from the singlet state of the high energy state organic compound to the singlet state of the thermally activated delayed fluorescent material.

When the blue light emitting layer comprises at least one high energy state organic light emitting compound and a thermally activated delayed fluorescent material doped therein, in the light emitting layer doped with the thermally activated delayed fluorescent material, the volume ratio of the thermally activated delayed fluorescent material is preferably ≤50%, for example, 48%, 46%, 44%, 42%, 38%, 35%, 33%, 28%, 24%, 21%, 18%, 15%, 13%, 11%, 8%, and 6%, etc., further preferably ≤25%, and particularly preferably ≤15%.

The volume ratio of the thermally activated delayed fluorescent material in the light emitting layer determines the concentration of the exciton and the sufficiency of energy transfer, and a volume ratio of 50% or less can ensure that the energy is sufficient without causing the concentration of the exciton to be too high to result in the quenching of the exciton which reduces the efficiency and lifetime of the device.

In another preferred specific embodiment, the at least one light emitting layer includes at least a blue light emitting layer; the blue light emitting layer includes at least one high energy state organic light emitting compounds, at least one low energy state organic light emitting compounds and a thermally activated delayed fluorescent material doped therein;

the lowest singlet energy level of the high energy state organic light emitting compound is higher than the lowest singlet energy level of the thermally activated delayed fluorescent material;

the lowest singlet energy level of the low energy state organic light emitting compound is lower than the lowest singlet energy level of the thermally activated delayed fluorescent material.

When the light emitting layer is doped with a thermally activated delayed fluorescent material, an organic compound with high energy state and an organic compound with low energy state are selected as the host material at the same time, and the luminescence manner further includes the transition from the triplet state to the singlet state of the thermally activated delayed fluorescent material in addition to the transition from the singlet state of the high energy state organic compound to the singlet state of the low energy state organic compound (including the direct transition from the singlet state of the high energy state organic compound to the singlet state of the low energy state organic compound, and the transition firstly from the singlet state of the high energy state organic compound to the singlet state of the thermally activated delayed fluorescent material, then to the singlet state of the low energy state organic compound). Thus, "the blue light emitting layer includes at least one high energy state organic light emitting compounds, at least one low energy state organic light emitting compounds and a thermally activated delayed fluorescent material doped therein" can further realize excellent energy transfer, and achieve the purpose of high efficiency.

When the blue light emitting layer includes at least one high energy state organic light emitting compound, at least one low energy state organic light emitting compound and a thermally activated delayed fluorescent material doped therein, in the blue light emitting layer, the volume ratio of the high energy state organic light emitting compound is preferably ≥50%, for example, 52%, 55%, 57%, 59%, 61%, 63%, 67%, 69%, 72%, 74%, 76%, 78%, 82%, 85%, 88%, 92%, and 95%, etc.

When the blue light emitting layer includes at least one high energy state organic light emitting compound, at least one low energy state organic light emitting compound and a thermally activated delayed fluorescent material doped therein, in the blue light emitting layer, the volume ratio of the low energy state organic light emitting compound is ≤10%, for example, 9%, 8%, 7%, 6%, 5%, 4%, 3%, 2%, and 1%, etc.

In a preferred specific embodiment, the energy level difference between the lowest singlet state $S_T$ and the lowest triplet state $T_T$ of the thermally activated delayed fluorescent material is $\Delta E_{st}=E_{ST}-E_{TT} \leq 0.30$ eV, for example, 0.29 eV, 0.28 eV, 0.27 eV, 0.26 eV, 0.25 eV, 0.24 eV, 0.23 eV, 0.22 eV, 0.21 eV, 0.20 eV, 0.19 eV, 0.18 eV, 0.16 eV, 0.14 eV, 0.13 eV, 0.12 eV, 0.11 eV, 0.10 eV, 0.09 eV, 0.08 eV, 0.07 eV, 0.06 eV, 0.05 eV, 0.04 eV, 0.03 eV, 0.02 eV, and 0.01 eV, etc. When $\Delta E_{st}>0.30$ eV, the fluorescence delay effect of the compound is not obvious.

Preferably, the compound has $\Delta E_{st} \leq 0.25$ eV; further preferably, the compound has $\Delta E_{st} \leq 0.15$ eV; even further preferably, the compound has $\Delta E_{st} \leq 0.10$ eV; still further preferably, the compound has $\Delta E_{st} \leq 0.05$ eV; particularly further preferably, the compound has $\Delta E_{st} \leq 0.02$ eV; and most preferably, the compound has $\Delta E_{st} \leq 0.01$ eV.

The present disclosure is not particularly limited to a specific thermally activated delayed fluorescent material, and any thermally activated delayed fluorescent material that can be obtained by those skilled in the art can be used in the OLED display panel according to the present disclosure.

As the first aspect of the specific embodiments, the thermally activated delayed fluorescent material is any one or a combination of at least two selected from the group consisting of the compounds having the structure represented by formula (S-1);

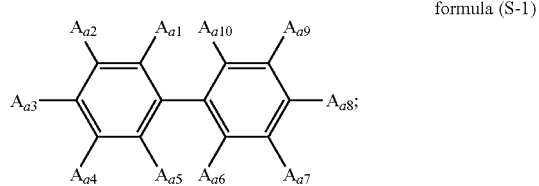

formula (S-1)

in formula (S-1), $A_{a1}$, $A_{a2}$, $A_{a3}$, $A_{a4}$, $A_{a5}$, $A_{a6}$, $A_{a7}$, $A_{a8}$, $A_{a9}$, and $A_{a10}$ are each independently selected from a hydrogen atom, a nitrile group or a functional group having a structure of formula (II); and among $A_{a1}$, $A_{a2}$, $A_{a3}$, $A_{a4}$, $A_{a5}$, $A_{a6}$, $A_{a7}$, $A_{a8}$, $A_{a9}$, and $A_{a10}$, there exists at least one nitrile group and at least one group having a structure of formula (S-1a);

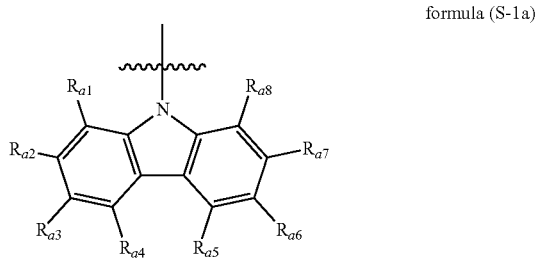

formula (S-1a)

in formula (S-1a), $R_{a1}$, $R_{a2}$, $R_{a3}$, $R_{a4}$, $R_{a5}$, $R_{a6}$, $R_{a7}$, and $R_{a8}$ are each independently selected from a hydrogen atom, a deuterium atom or a $C_{6-30}$ aromatic group or a $C_{2-30}$ heterocyclic aromatic group.

Exemplarily, the thermally activated delayed fluorescent material described in one of the specific embodiments comprises:

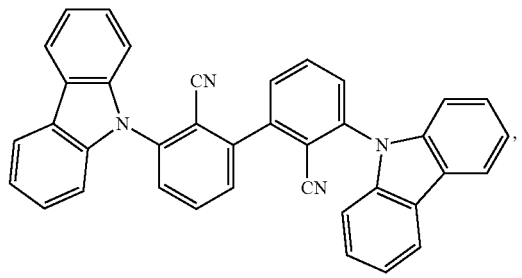

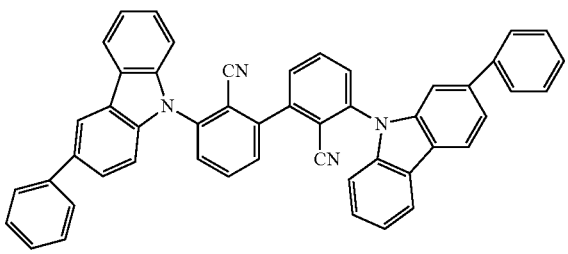

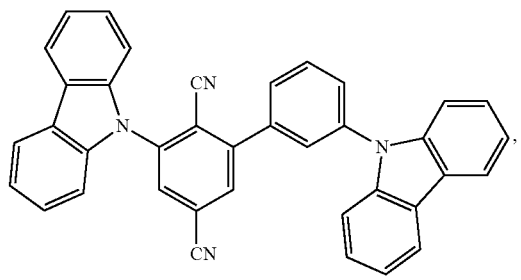

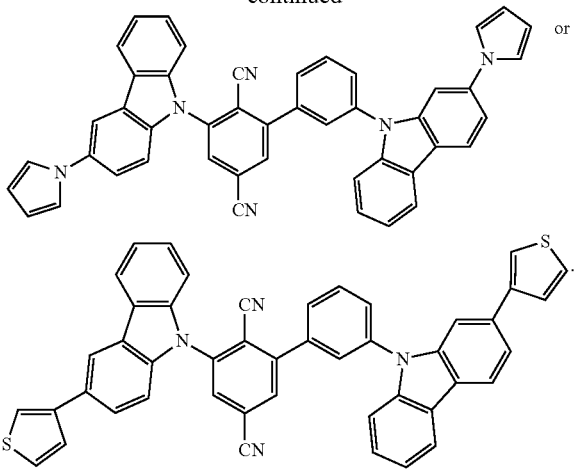

As the second aspect of the specific embodiments, the thermally activated delayed fluorescent material is any one or a combination of at least two selected from the group consisting of the compounds having the structure represented by formula (S-2);

formula (S-2)

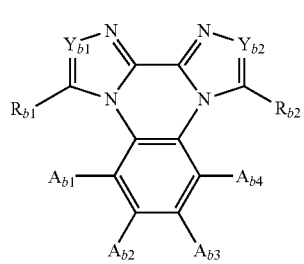

in formula (S-2), $A_{b1}$, $A_{b2}$, $A_{b3}$, and $A_{b4}$ are each independently selected from a hydrogen atom or a functional group having a structure of formula (S-2b), and at least one of $A_{b1}$, $A_{b2}$, $A_{b3}$, and $A_{b4}$ is a functional group having a structure of formula (S-2b); $R_{b1}$ and $R_{b2}$ are each independently selected from a hydrogen atom, a deuterium atom, a $C_1$-$C_{30}$ alkyl, a $C_{6-30}$ aromatic group or a $C_{2-30}$ heterocyclic aromatic group; $Y_{b1}$, and $Y_{b2}$ are each independently selected from a substituted or unsubstituted carbon or nitrogen.

formula (S-2b)

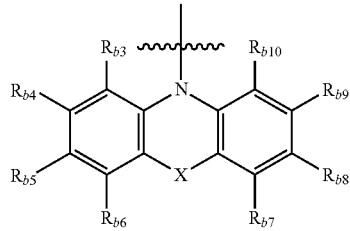

In formula (S-2b), X is any one selected from the group consisting of an oxy group, a thio group, a substituted or unsubstituted imino group, a substituted or unsubstituted methylene group, a substituted or unsubstituted silicylene group;

$R_{b3}$, $R_{b4}$, $R_{b5}$, $R_{b6}$, $R_{b}c$, $R_{b8}$, $R_{b9}$, and $R_{b10}$ are each independently selected from any one of a hydrogen atom, a deuterium atom, a $C_1$-$C_{30}$ alkyl group, a $C_{6-30}$ aromatic group or a $C_{2-30}$ heterocyclic aromatic group.

Exemplarily, the thermally activated delayed fluorescent material described in one of the specific embodiments comprises:

anyone of

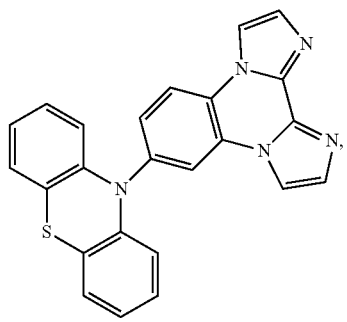

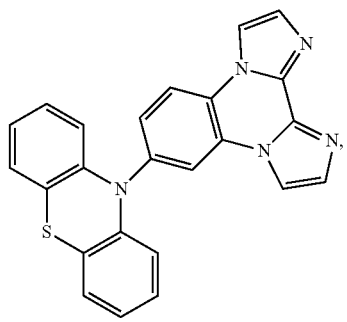

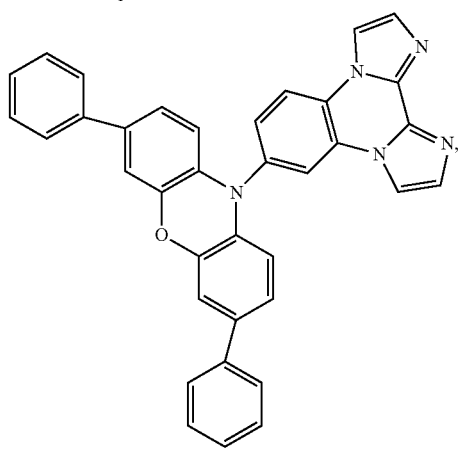

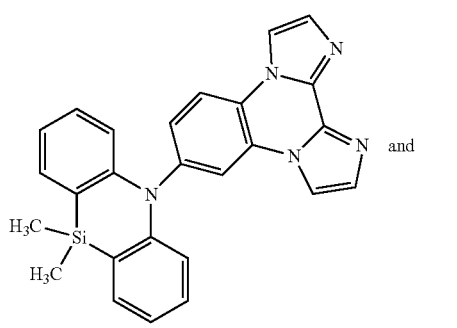

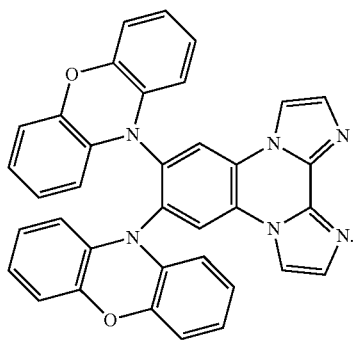
The thermally activated delayed fluorescent material according to the present disclosure can also be selected from any thermally activated delayed fluorescent materials known to those skilled in the art, for example, such as:
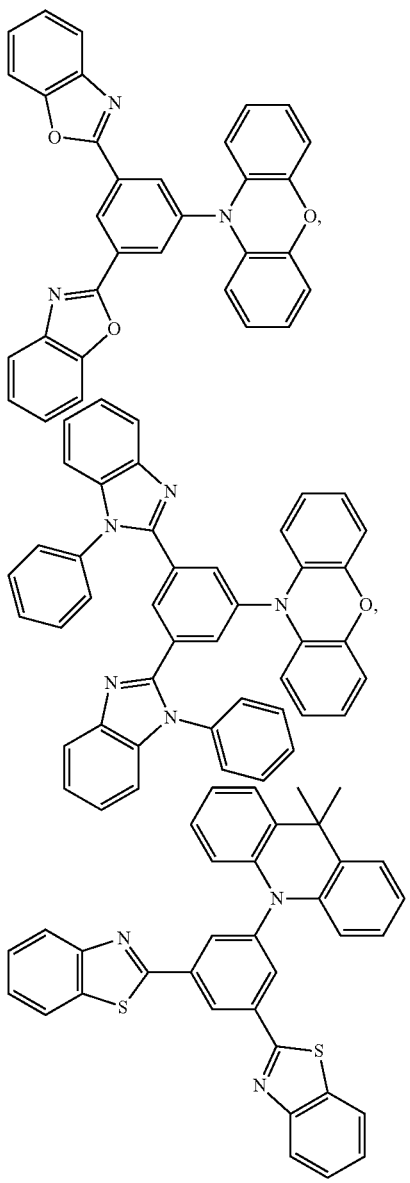
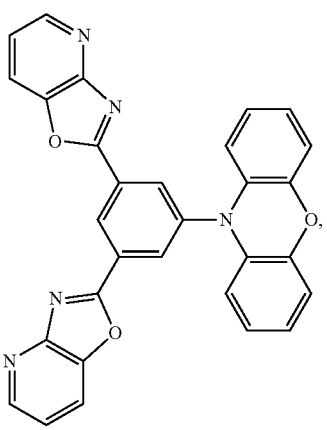
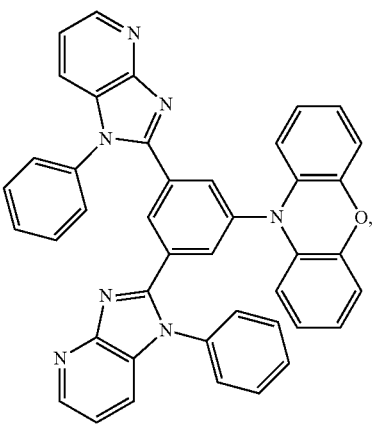
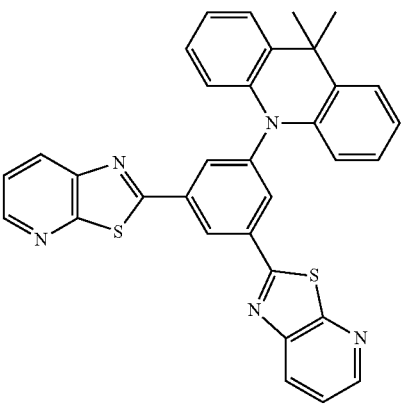

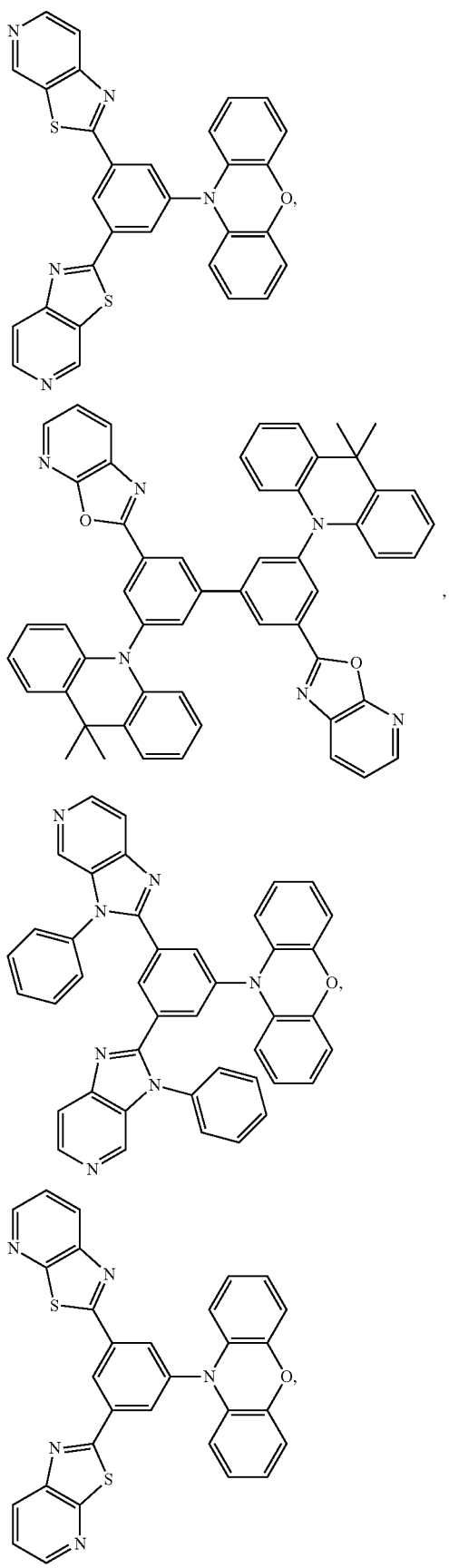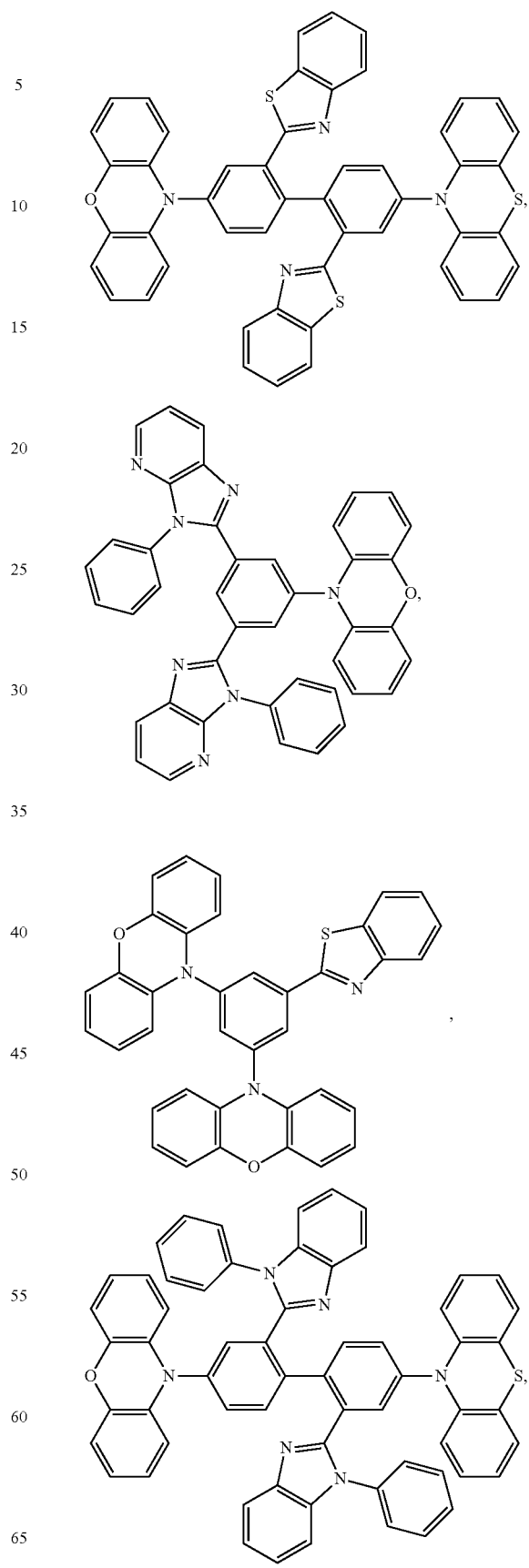

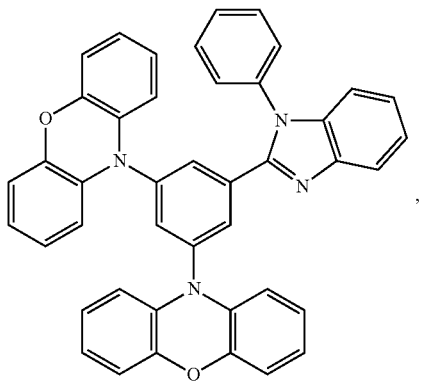
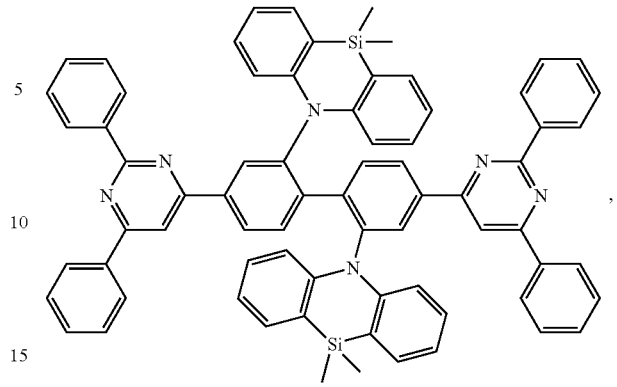
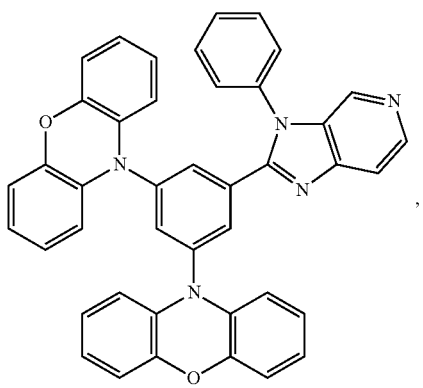
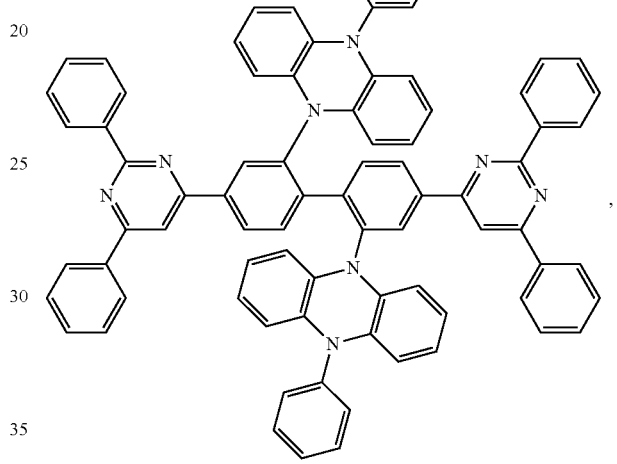
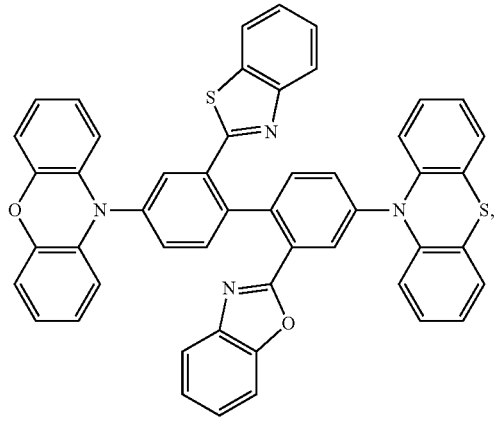
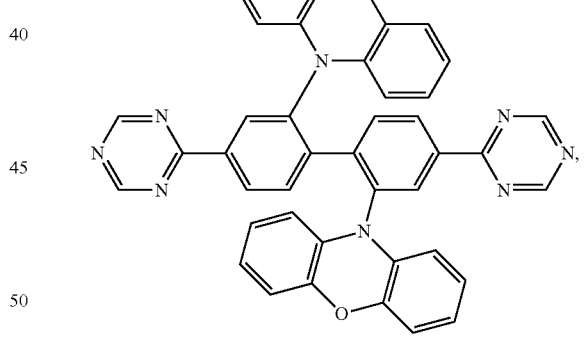
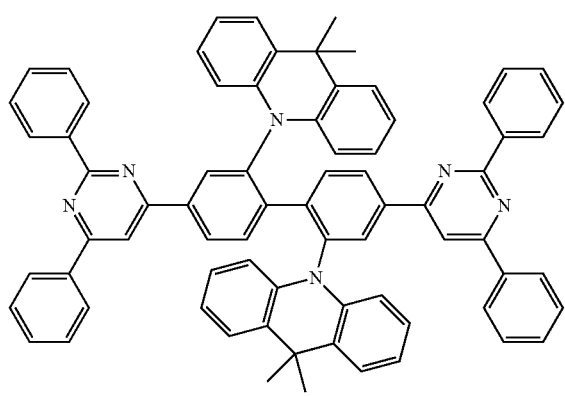
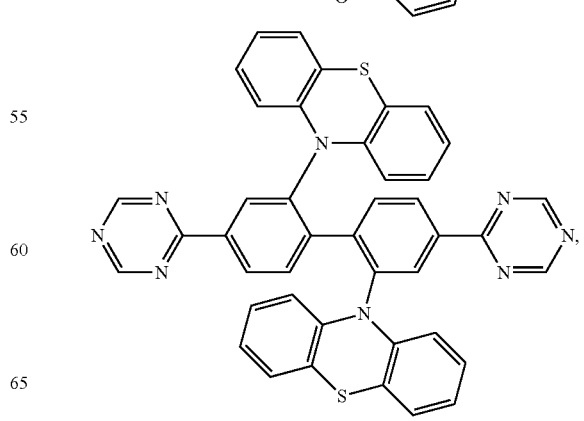

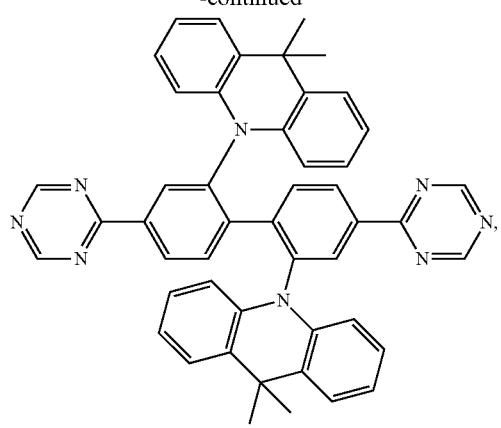
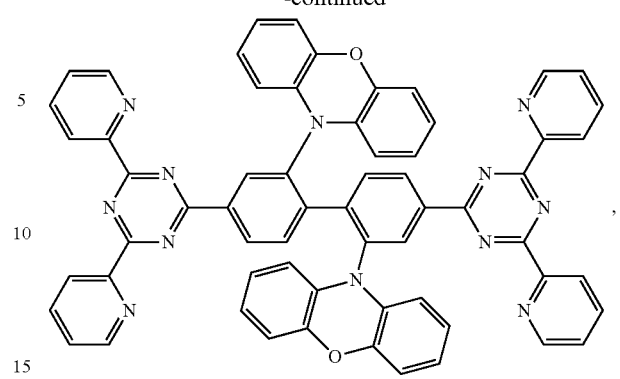
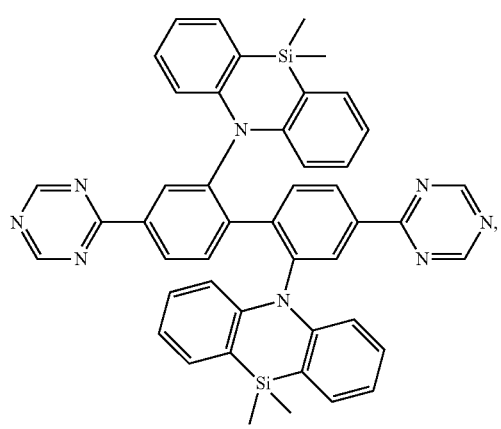
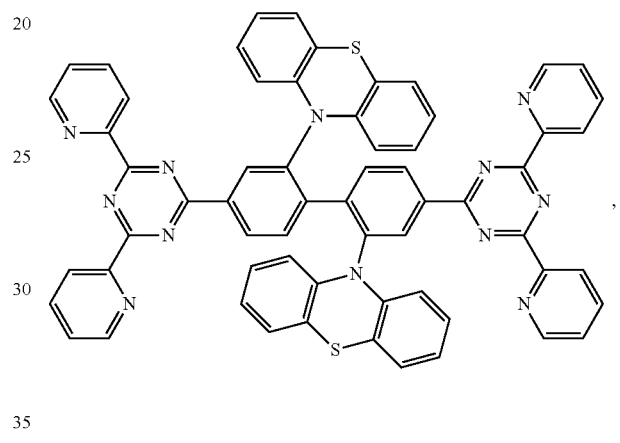
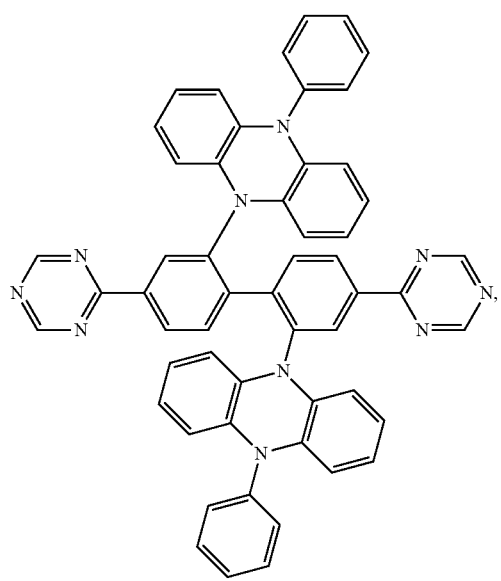
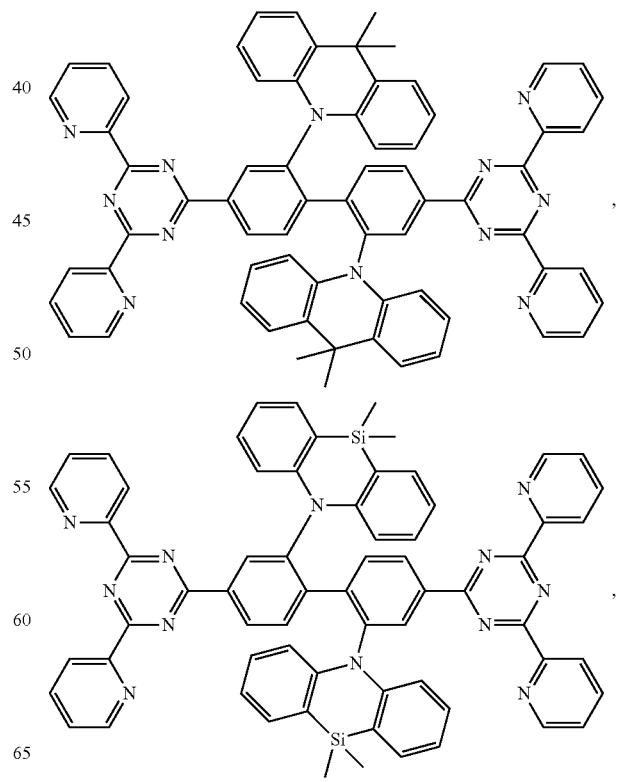

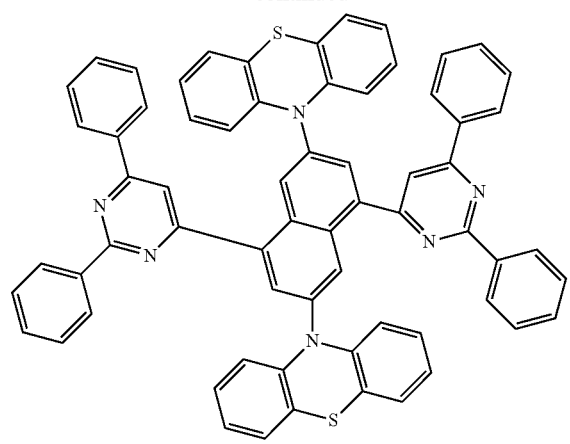
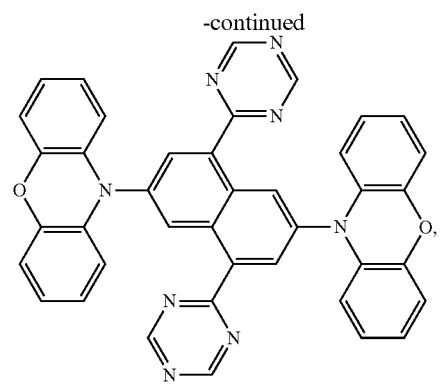
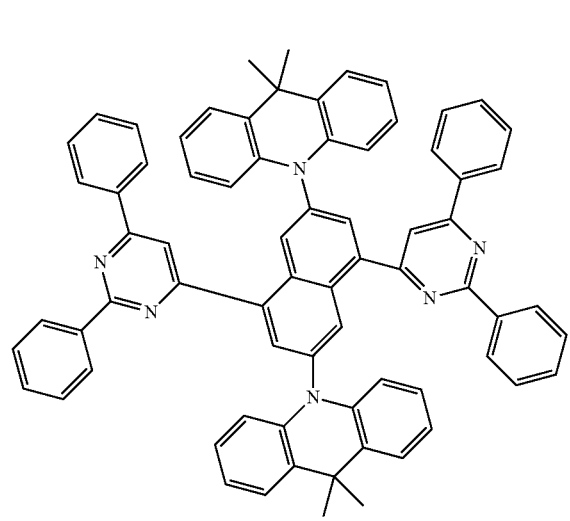
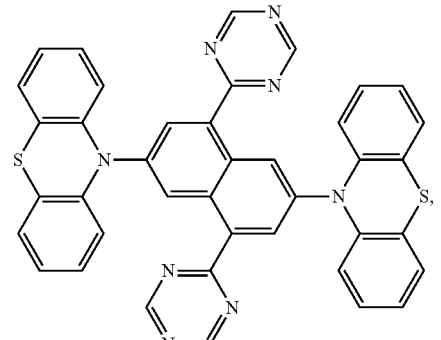
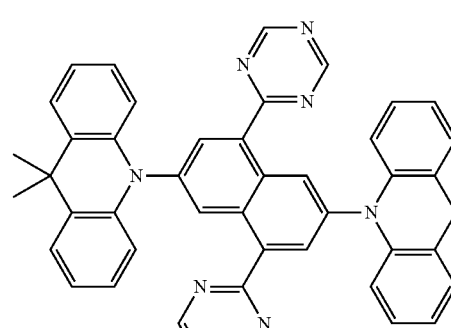
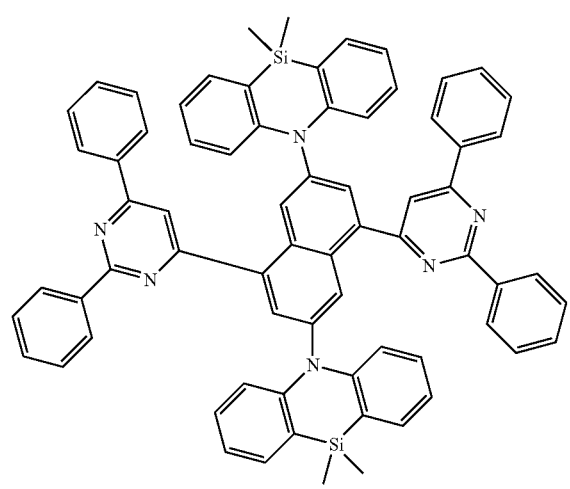
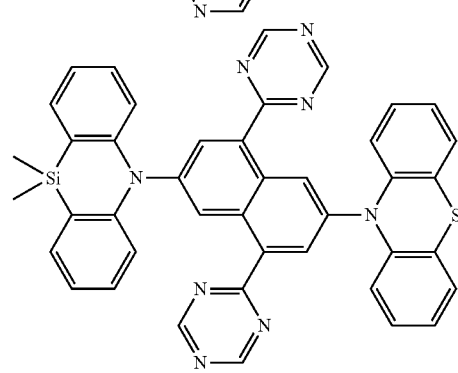

-continued

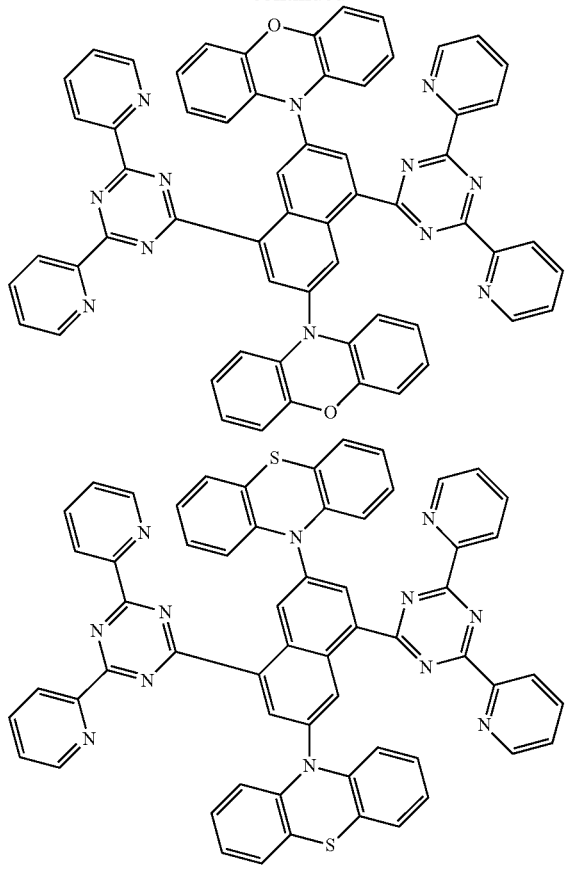

Figure 2:
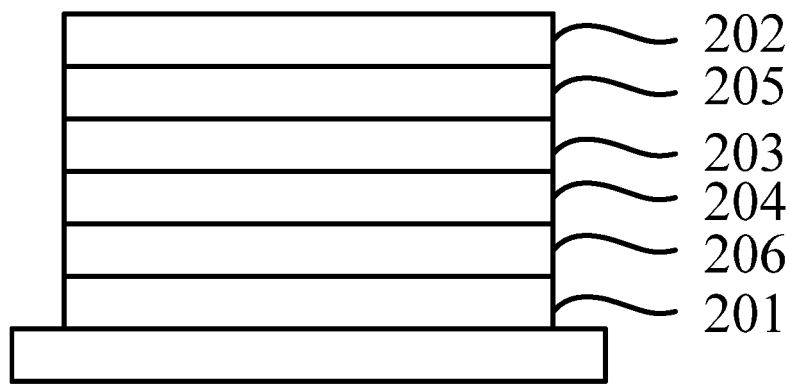
FIG. 2 is a cross-sectional structural representation of an OLED display panel provided in a specific embodiment of the present disclosure.

In a further specific embodiment, referring to FIG. 2, an OLED display panel exemplarily has the structure as shown in FIG. 2, which comprises a first electrode 201 and a second electrode 202, at least one light emitting layer 203 disposed between the first electrode 201 and the second electrode 202; a first functional layer 204 and a second functional layer 205 disposed on both sides of each light emitting layer 203 respectively; a third functional layer 206 disposed between the first electrode 201 and the first functional layer 204, and the third functional layer comprises at least one hole transport compound having a structure of formula (K-1);

formula (K-1)

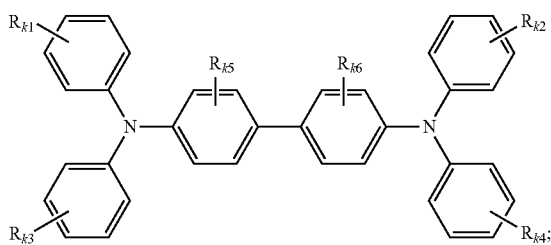

In formula (K-1), $R_{k1}$, $R_{k2}$, $R_{k3}$, $R_{k4}$, $R_{k5}$, and $R_{k6}$ are each independently any one selected from the group consisting of hydrogen, an unsubstituted phenyl, or a phenyl group having a C1-C6 alkyl substituent; $R_{k5}$ and $R_{k6}$ are each independently selected from any one of hydrogen, an unsubstituted C1-C6 alkyl, fluorine or chlorine.

The third functional layer has a function for transporting holes and adjusting the length of optical cavity.

Figure 3:
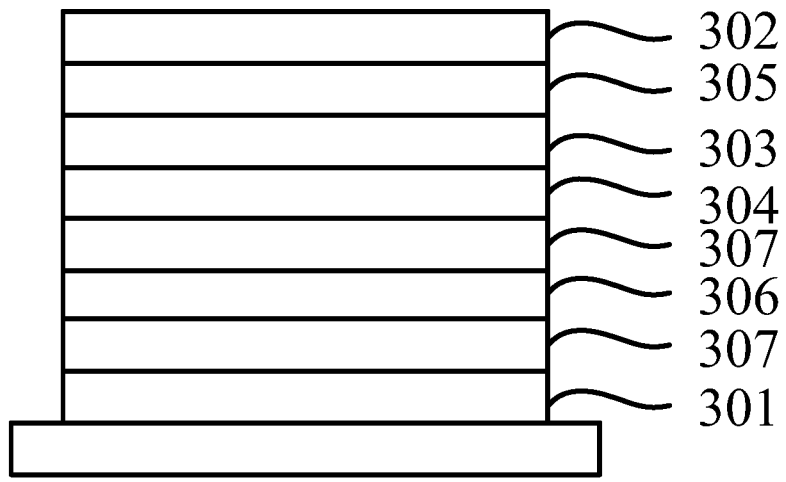
FIG. 3 is a cross-sectional structural representation of an OLED display panel provided in a specific embodiment of the present disclosure.

In a specific embodiment, the hole transport compound having a structure of formula (K-1) includes and/or In a further specific embodiment, refer to FIG. 3, an OLED display panel exemplarily has the structure as shown in FIG. 3, which comprises a first electrode 301 and a second electrode 302, at least one light emitting layer 303 disposed between the first electrode 301 and the second electrode 302; a first functional layer 304 and a second functional layer 305 disposed on both sides of each light emitting layer 303 respectively; a third functional unit disposed between the first electrode 301 and the first functional layer 304, and the third functional unit comprises a third functional layer 306 and auxiliary functional layers 3071 and 3072 disposed on both sides of the third functional layer 306, respectively. The auxiliary functional layer includes a hole transport compound having a structure of formula (K-1) and a dopant having a structure of formula (C-1) doped in the hole transport compound having a structure of formula (K-1);

formula (C-1)

in formula (C-1), $R_{C1}$ includes a fluorine-substituted aromatic ring group.

The auxiliary functional layer has a function of assisting holes to be injected from the anode into the hole transport layer.

In a specific embodiment, the dopant having a structure of formula (C-1) includes

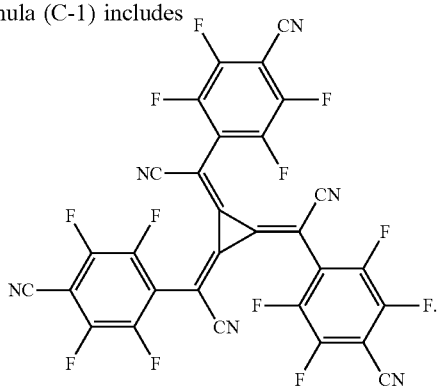

In a specific embodiment, the second functional layer comprises a host material having a structure of formula (D-1) and a dopant dispersed in the host material, the dopant comprises a metal and/or a metal compound;

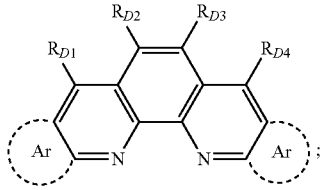
formula (D-1)

in formula (D-1), $R_{D1}$, $R_{D2}$, $R_{D3}$ and $R_{D4}$ are each independently selected from any one of hydrogen, an alkyl group, a substituted or unsubstituted aromatic group; a metal element in the metal and/or the metal compound includes any one of an alkali metal, an alkaline earth metal and a rare earth metal.

The selection of a host material having a structure of formula (D-1) and a dopant dispersed in the host material, so as to obtain a second functional layer, is capable of achieving high electron mobility and good electron injection.

In a specific embodiment, the host material having a structure of formula (D-1) includes

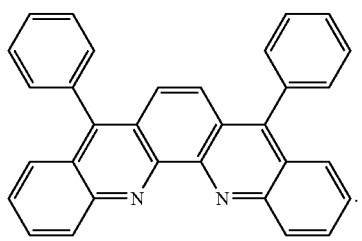 [SMILES: c1ccc(-c2c3ccccc3nc3c2ccc2c(-c4ccccc4)c4ccccc4nc23)cc1]

In a specific embodiment, the metal element in the metal and/or the metal compound includes lithium, calcium, ytterbium, or magnesium.

Preferably, the metal element in the metal and/or the metal compound is lithium.

In a specific embodiment, the second electrode includes silver or silver alloy; an alloy element of the silver alloy includes any one or a combination of at least two of an alkali metal element, an alkaline earth metal element and a rare earth metal element.

Preferably, the alloy element of the silver alloy includes any one or a combination of at least two of lithium, calcium, ytterbium, and magnesium.

In a specific embodiment, the first electrode comprises at least two functional layers, and the at least two functional layers include a reflective film and a conductive transparent thin film.

Preferably, the reflective film includes silver.

Preferably, the conductive transparent thin film includes an ITO film or an IZO film.

In a specific embodiment, the second electrode includes magnesium silver alloy, silver metal, silver ytterbium alloy or silver rare-earth metal alloy.

In a specific embodiment, a light from the OLED display panel is emitted from the second electrode.

Figure 4:
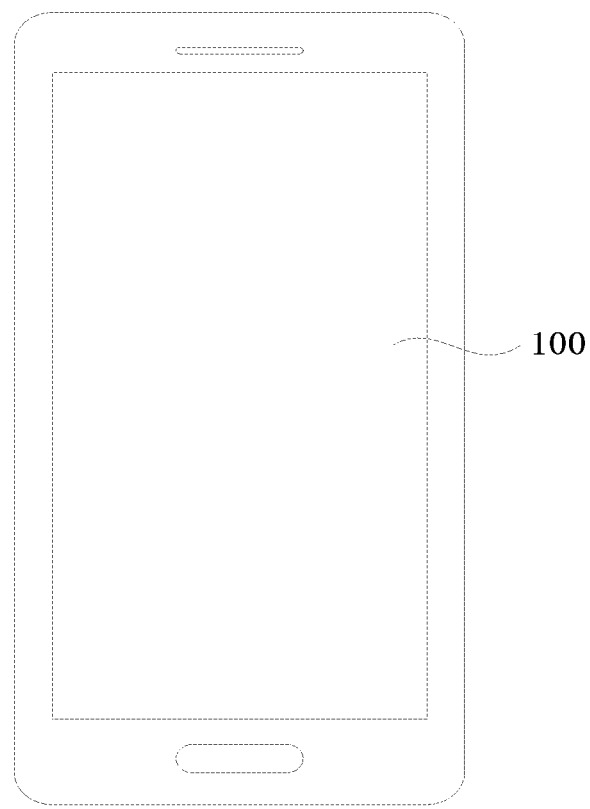
FIG. 4 is a structural representation of a display device provided in an example of the present disclosure.

In a specific embodiment, the present disclosure also provides a display device comprising the OLED display panel as previously described in any one of the embodiments. The display device may be a mobile phone as shown in FIG. 4, and may also be a computer, a television set, and an intelligent wearing device, etc., however, the examples of the present disclosure is not particularly limited thereto.

Performance tests for a number of examples and comparative examples provided by the present disclosure are also carried out in the present disclosure, and the test method is as follows:

The currents of the organic photo electronic devices manufactured in the examples and comparative examples at different voltages were tested with an instrument like Keithley 2365A digital nanovoltmeter, and then the current densities of the organic photo electronic devices at different voltages were obtained by dividing the currents by the light emitting area. The luminance and radiant energy flux density of the organic photoelectronic device manufactured in the test examples and comparative examples at different voltages were tested with an instrument like Konicaminolta CS-2000 spectro-radiometry luminance meter. According to the current density and luminance of the organic photo electronic device at different voltages, the current efficiency (Cd/A) and the external quantum efficiency EQE at the same current density (0.1 mA/cm$^2$) were obtained.

Examples 1, 3, 4, 6, 7, 9, 10, 11, and 12 and Comparative Examples 1 and 3 have the structure as shown in FIG. 3, which specifically comprises:

a substrate 1, an ITO electrode 301, a first doping layer 3071 (thickness: 10 nm), a third functional layer 306 (thickness: 60 nm), a second doping layer 3072 (thickness: 10 nm), a first hole transport layer 304 (thickness: 30 nm), a light emitting layer 303 (thickness: 30 nm), a first electron transport layer 305 (thickness: 30 nm), and a silver electrode 302 (thickness: 100 nm).

Figure 5:
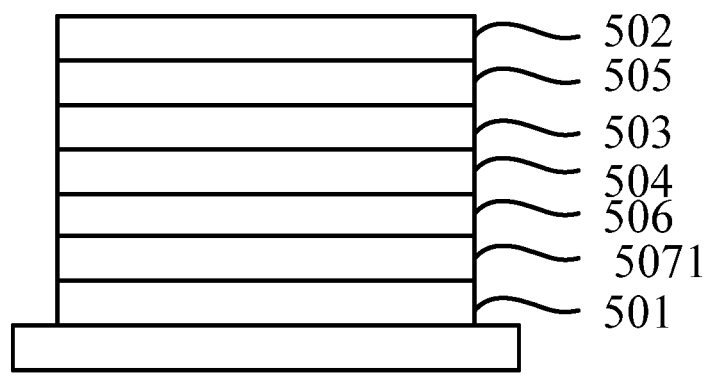
FIG. 5 is a cross-sectional structural representation of the OLED display panels in Example 2 and Comparative Example 2 when the performance test is carried out in the present disclosure.

Examples 2 and Comparative Example 2 have the structure as shown in FIG. 5, which specifically comprises:

a substrate 1, an ITO electrode 501, a first doping layer 5071 (thickness: 10 nm), a third functional layer 506 (thickness: 60 nm), a first hole transport layer 504 (thickness: 30 nm), a light emitting layer 503 (thickness: 30 nm), a first electron transport layer 505 (thickness: 30 nm), and a silver electrode 502 (thickness: 100 nm).

Figure 6:
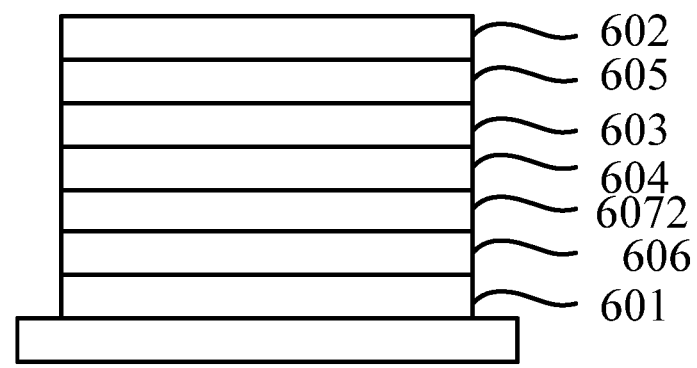
FIG. 6 is a cross-sectional structural representation of the OLED display panels in Example 5 and Comparative Example 4 when the performance test is carried out in the present disclosure.

Examples 5 and Comparative Example 4 have the structure as shown in FIG. 6, which specifically comprises:

a substrate 1, an ITO electrode 601, a third functional layer 606 (thickness: 60 nm), a second doping layer 6072 (thickness: 10 nm), a first hole transport layer 604 (thickness: 30 nm), a light emitting layer 603 (thickness: 30 nm), a first electron transport layer 605 (thickness: 30 nm), and a silver electrode 602 (thickness: 100 nm).

Examples 8 and Comparative Example 6 have the structure as shown in FIG. 1, which specifically comprises:

a substrate 1, a first electrode 101 (an ITO electrode), a first functional layer 104 (a hole transport layer) (thickness: 30 nm), a light emitting layer 503 (thickness: 30 nm), a second functional layer 105 (an electron transport layer) (thickness: 30 nm), and a second electrode 102 (a silver electrode) (thickness: 100 nm).

The selected materials for each layer of the OLED display panels in Examples 1-6 are shown in Table 1-1 and Table 1-2:

TABLE 1-1

The selected materials for each layer of the OLED display panels in Examples 1-6

| Structure | | 1 | 2 | 3 | 4 | 5 | 6 |
|---|---|---|---|---|---|---|---|
| The first doping layer | | K:C (1:100) | K:C (1:100) | K:C (1:100) | K:C (1:100) | — | K:C (1:100) |
| The third functional layer | | K | K | K | K | K | K |
| The second doping layer | | K:C (1:100) | — | K:C (1:100) | K:C (1:100) | K:C (1:100) | K:C (1:100) |
| The first hole transport layer | | HT1 | HT1 | HT1 | HT1 | HT1 | HT1 |
| The light emitting layer | Materials Doping ratio | BH:S1:BD (80:15:5) | BH:S1:BD (80:15:5) | BH:S1:BD (80:15:5) | BH:S1 (90:10) | BH:S1 (90:10) | BH:S1:BD (90:1:9) |
| The first electron transport layer | | ET1:Yb (100:1) | ET1:Yb (100:1) | ET1:Yb (100:1) | ET1:Yb (100:1) | ET1:Yb (100:1) | ET2:Yb (100:1) |
| The silver electrode layer | | Ag | Ag | MgAg alloy | Ag | Ag | Ag |

TABLE 1-2

The selected materials for each layer of the OLED display panels in Examples 7-12

| Structure | | 7 | 8 | 9 | 10 | 11 | 12 |
|---|---|---|---|---|---|---|---|
| The first doping layer | | K:C (1:100) | — | K:C (1:100) | K:C (1:100) | K:C (1:100) | K:C (1:100) |
| The third functional layer | | K | — | K | K | K | K |
| The second doping layer | | K:C (1:100) | — | K:C (1:100) | K:C (1:100) | K:C (1:100) | K:C (1:100) |
| The first hole transport layer | | HT1 | HT1 | HT1 | HT1 | HT1 | HT1 |
| The light emitting layer | Materials Doping ratio | BH:S1:BD (45:50:5) | BH:S1:BD (80:15:5) | BH:S2:BD (80:15:5) | BH:S3:BD (80:15:5) | BH:S4:BD (80:15:5) | BH:S5:BD (80:15:5) |
| The first electron transport layer | | ET2:Yb (100:1) | ET1:Yb (100:1) | ET1:Yb (100:1) | ET1:Yb (100:1) | ET1:Yb (100:1) | ET1:Yb (100:1) |
| The silver electrode layer | | Ag | Ag | Ag | Ag | Ag | Ag |

TABLE 1-3

The selected materials for each layer of the OLED display panels in comparative examples

| Structure | 1 | 2 | 3 | 4 | 5 | 6 |
|---|---|---|---|---|---|---|
| The first doping layer | K:C (1:100) | K:C (1:100) | K:C (1:100) | — | K:C (1:100) | — |
| The third functional layer | K | K | K | K | K | — |
| The second doping layer | K:C (1:100) | — | K:C (1:100) | K:C (1:100) | K:C (1:100) | — |
| The first hole transport layer | HT1 | HT1 | HT1 | HT1 | — | HT1 |
| The light emitting layer | BH:BD (95:5) | BH:BD (95:5) | BH:BD (95:5) | BH:BD (95:5) | BH:BD (95:5) | BH:BD (95:5) |
| The first electron transport layer | ET1:Yb (100:1) | ET1:Yb (100:1) | ET1:Yb (100:1) | ET1:Yb (100:1) | ET1:Yb (100:1) | ET2:Yb (100:1) |
| The silver electrode layer | Ag | Ag | MgAg alloy | Ag | Ag | Ag |

In Table 1-1, Table 1-2 and Table 1-3, the meaning of each code name is explained in Table 2.

TABLE 2
Chemical formula for each code name in Table 1-1 and Table 1-2
| Code name | Chemical formula |
|---|---|
| K | 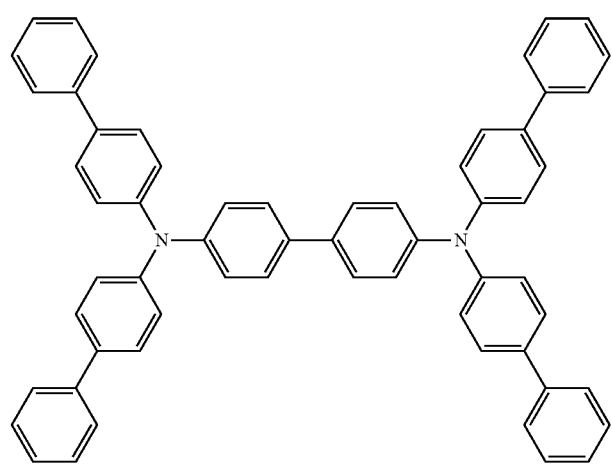 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] |
| C | 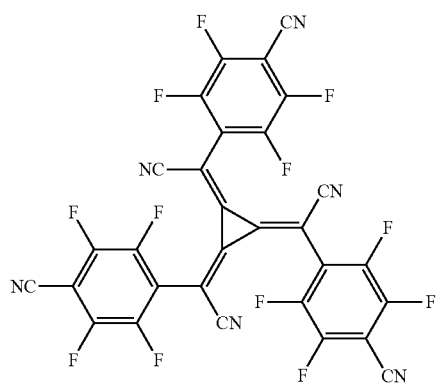 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F] |
| NPB | 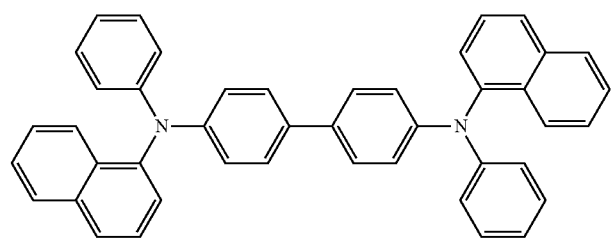 [SMILES: c1ccc(N(c2ccc(-c3ccc(N(c4ccccc4)c4cccc5ccccc45)cc3)cc2)c2cccc3ccccc23)cc1] |

TABLE 2-continued

Chemical formula for each code name in Table 1-1 and Table 1-2

| Code name | Chemical formula |
| --- | --- |
| HT1 | |
| BH (the high energy state organic light emitting compound) | |
| BD (the low energy state organic light emitting compound) | |

TABLE 2-continued

Chemical formula for each code name in Table 1-1 and Table 1-2

| Code name | Chemical formula |
|---|---|
| S1 | |
| S2 | |
| S3 | |
| S4 | |
| S5 | |

TABLE 2-continued

Chemical formula for each code name in Table 1-1 and Table 1-2

| Code name | Chemical formula |
|---|---|
| ET1 | (structure) |
| ET2 | (structure) |

The results of the performance tests for the OLED display panels provided in the examples and the comparative examples are shown in Table 3.

TABLE 3

The results of the performance tests for the OLED display panels provided in the examples and the comparative examples

| | Voltage (condition: 10 mA/cm$^{-2}$) | EQE (condition: 1 mA/cm$^{-2}$) |
|---|---|---|
| Example 1 | 3.3 V | 7% |
| Example 2 | 3.2 V | 6.3% |
| Example 3 | 3.3 V | 6.5% |
| Example 4 | 3.3 V | 12.2% |
| Example 5 | 5.6 V | 4.7% |
| Example 6 | 7.6 V | 6.2% |
| Example 7 | 7.7 V | 5.8% |
| Example 8 | 6.6 V | 3.8% |
| Example 9 | 3.2 V | 7.2% |
| Example 10 | 3.4 V | 7.1% |
| Example 11 | 3.3 V | 6.8% |
| Example 12 | 3.3 V | 6.9% |
| Comparative Example 1 | 3.2 V | 6.0% |
| Comparative Example 2 | 3.3 V | 5.7% |
| Comparative Example 3 | 3.3 V | 5.2% |
| Comparative Example 4 | 5.5 V | 2.5% |
| Comparative Example 5 | 7.5 V | 2.0% |
| Comparative Example 6 | 6.1 V | 1.0% |

As can be seen from Table 1-3, the luminous efficiency can be improved by using the thermally activated delayed fluorescent material through reasonably arrangement of the structure of the device. In particular, the external quantum efficiency (EQE) of the OLED display panel can be significantly improved by using a thermally activated delayed material as a dopant to mix with the host material, under the premise that the voltage does not change much, for example, the voltages of Examples 1-4 were in the range of 3.2-3.3V, and the external quantum efficiency was more than 6.5%; on the contrary, the voltage of the Comparative Examples 1-3 were in the range of 3.2-3.3V, and the external quantum efficiency was below 6.0%. As can be seen from the results of Examples 2 and 5 and Example 1, the arrangement of the third functional layer and the incorporation of the thermally activated delayed material can effectively improve the external quantum efficiency of the OLED device. As can be seen from the results of Examples 1, 6 and 7, when the doping amount of the thermally activated delayed material was 15%, the OLED device had the highest external quantum efficiency. However, as can be seen from the results of the Comparative Examples 1 to 6 and the examples, regardless of the presence of the third functional layer and the structure of the third functional unit, the external quantum efficiency of the corresponding device can be improved only if the thermally activated delayed material was doped therein.

Applicant has stated that although the detailed process equipment and process flow of the present disclosure have been described by the above examples in the present disclosure, the present disclosure is not limited thereto, that is to say, it is not meant that the present disclosure has to be implemented depending on the above detailed process equipment and process flow. It will be apparent to those skilled in the art that any improvements made to the present disclosure, equivalent replacements to the raw materials of the products of the present disclosure and addition of adjuvant ingredients, and choices of the specific implementations, etc., all fall within the protection scope and the disclosure scope of the present disclosure.

What is claimed is:

1. An OLED display panel, comprising:
   a first electrode, a second electrode, a light emitting layer disposed between the first electrode and the second electrode; and
   a first functional layer and a second functional layer disposed on a first and a second sides of the light emitting layer respectively, wherein the first functional layer comprises at least one compound having a hole transport capability,
   wherein the second functional layer comprises at least one compound having an electron transport capability;
   wherein the light emitting layer comprises an organic light emitting compound;
   wherein the light emitting layer is doped with a thermally activated delayed fluorescent material;
   wherein a lowest triplet energy level of the organic light emitting compound ($T_H$) is higher than a lowest singlet energy level of the thermally activated delayed fluorescent material ($S_T$);
   wherein the lowest triplet energy level of the compound having a hole transport capability ($T_1$) and the lowest triplet energy level of the organic light emitting compound ($T_H$) satisfy formula (I):

$T_1 - T_H > -0.2$ eV  formula (I);

wherein the lowest triplet energy level of the compound having an electron transport capability ($T_2$) and the lowest triplet energy level of the organic light emitting compound ($T_H$) satisfy formula (II):

$T_2 - T_H > -0.2$ eV  formula (II); and wherein an energy level difference between a lowest singlet state $S_T$ and a lowest triplet state $T_T$ of the thermally activated delayed fluorescent material is $\Delta E_{st} = E_{ST} - E_{TT} \leq 0.30$ eV.

2. The OLED display panel according to claim 1, wherein the light emitting layer comprises a blue light emitting layer; wherein the blue light emitting layer comprises a first organic light emitting compound and a thermally activated delayed fluorescent material doped therein;
   wherein the lowest singlet energy level of the first organic light emitting compound is higher than the lowest singlet energy level of the thermally activated delayed fluorescent material.

3. The OLED display panel according to claim 2, wherein in the light emitting layer, the volume ratio of the thermally activated delayed fluorescent material is ≤50%.

4. The OLED display panel according to claim 2, wherein in the light emitting layer, the volume ratio of the thermally activated delayed fluorescent material is ≤25%.

5. The OLED display panel according to claim 2, wherein in the light emitting layer, the volume ratio of the thermally activated delayed fluorescent material is ≤15%.

6. The OLED display panel according to claim 1, wherein the light emitting layer comprises a blue light emitting layer; wherein the blue light emitting layer comprises a first organic light emitting compound, a second organic light emitting compound and a thermally activated delayed fluorescent material doped therein;
   wherein a lowest singlet energy level of the first organic light emitting compound is higher than a lowest singlet energy level of the thermally activated delayed fluorescent material;
   wherein a lowest singlet energy level of the second organic light emitting compound is lower than a lowest singlet energy level of the thermally activated delayed fluorescent material.

7. The OLED display panel according to claim 6, wherein a volume ratio of the first organic light emitting compound in the blue light emitting layer is ≥50%.

8. The OLED display panel according to claim 6, wherein a volume ratio of the second organic light emitting compound in the blue light emitting layer is ≤10%.

9. The OLED display panel according to claim 1, wherein that the thermally activated delayed fluorescent material is any one of or a combination of at least two selected from the group consisting of compounds having a structure represented by formula (S-1);

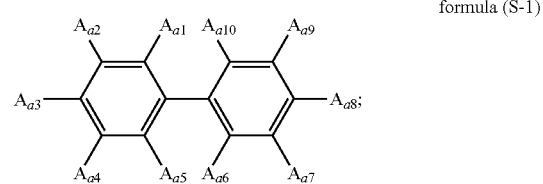

formula (S-1)

in formula (S-1), $A_{a1}$, $A_{a2}$, $A_{a3}$, $A_{a4}$, $A_{a5}$, $A_{a6}$, $A_{a7}$, $A_{a8}$, $A_{a9}$, and $A_{a10}$ are each independently selected from a hydrogen atom, a nitrile group or a functional group having a structure of formula (II); and among $A_{a1}$, $A_{a2}$, $A_{a3}$, $A_{a4}$, $A_{a5}$, $A_{a6}$, $A_{a7}$, $A_{a8}$, $A_{a9}$, and $A_{a10}$, there exists at least one nitrile group and at least one group having a structure of formula (S-1a);

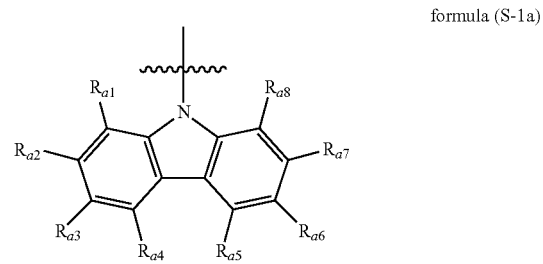

formula (S-1a)

in formula (S-1a), $R_{a1}$, $R_{a2}$, $R_{a3}$, $R_{a4}$, $R_{a5}$, $R_{a6}$, $R_{a7}$, and $R_{a8}$ are each independently selected from a hydrogen atom, a deuterium atom or a $C_{6-30}$ aromatic group or a $C_{2-30}$ heterocyclic aromatic group.

10. The OLED display panel according to claim 1, wherein that the thermally activated delayed fluorescent material is any one or a combination of at least two selected from the group consisting of the compounds having the structure represented by formula (S-2);

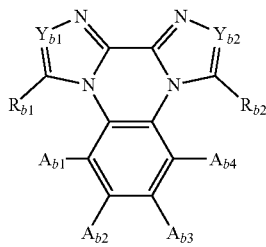

formula (S-2)

in formula (S-2), $A_{b1}$, $A_{b2}$, $A_{b3}$, and $A_{b4}$ are each independently selected from a hydrogen atom or a functional group having a structure of formula (S-2b), and at least one of $A_{b1}$, $A_{b2}$, $A_{b3}$, and $A_{b4}$ is a functional group having a structure of formula (S-2b); $R_{b1}$ and $R_{b2}$ are each independently selected from a hydrogen atom, a deuterium atom, a $C_1$-$C_{30}$ alkyl, a $C_{6-30}$ aromatic group or a $C_{2-30}$ heterocyclic aromatic group; $Y_{b1}$ and $Y_{b2}$ are each independently selected from a substituted or unsubstituted carbon or nitrogen;

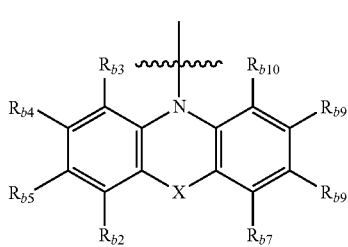

formula (S-2b)

wherein in formula (S-2b), X is any one selected from the group consisting of an oxy group, a thio group, a substituted or unsubstituted imino group, a substituted or unsubstituted methylene group, a substituted or unsubstituted silicylene group;
wherein $R_{b3}$, $R_{b4}$, $R_{b5}$, $R_{b6}$, $R_{b7}$, $R_{b8}$, $R_{b9}$, and $R_{b10}$ are each independently selected from any one of a hydrogen atom, a deuterium atom, a $C_1$-$C_{30}$ alkyl group, a $C_{6-30}$ aromatic group or a $C_{2-30}$ heterocyclic aromatic group.

11. The OLED display panel according to claim 1, wherein that the second electrode comprises silver or a silver alloy; and
wherein an alloy element of the silver alloy includes any one or a combination of at least two of an alkali metal element, an alkaline earth metal element and a rare earth metal element.

12. The OLED display panel according to claim 11, wherein that the alloy element of the silver alloy includes any one or a combination of at least two of lithium, calcium, ytterbium, and magnesium.

13. The OLED display panel according to claim 1, wherein that the first electrode comprises at least two functional layers, and the at least two functional layers comprising a reflective film and a conductive transparent thin film.

14. The OLED display panel according to claim 13, wherein that the reflective film includes silver;
the conductive transparent thin film comprises an ITO film or an IZO film.

15. The OLED display panel according to claim 1, wherein that the second electrode comprises magnesium silver alloy, silver metal, silver ytterbium alloy or silver rare-earth metal alloy.

16. The OLED display panel according to claim 1, wherein that a light from the OLED display panel is emitted from the second electrode.

17. A display device, wherein that it comprises the OLED display panel according to claim 1.

18. An OLED display panel, comprising:
a first electrode, a second electrode, a light emitting layer disposed between the first electrode and the second electrode; and
a first functional layer and a second functional layer disposed on a first and a second sides of the light emitting layer respectively, wherein the first functional layer comprises at least one compound having a hole transport capability,
wherein the second functional layer comprises at least one compound having an electron transport capability;
wherein the light emitting layer comprises an organic light emitting compound;
wherein the light emitting layer is doped with a thermally activated delayed fluorescent material;
wherein a lowest triplet energy level of the organic light emitting compound ($T_H$) is higher than a lowest singlet energy level of the thermally activated delayed fluorescent material ($S_T$);
wherein the lowest triplet energy level of the compound having a hole transport capability ($T_1$) and the lowest triplet energy level of the organic light emitting compound ($T_H$) satisfy formula (I):

$$T_1-T_H>-0.2 \text{ eV} \qquad \text{formula (I)};$$

wherein the lowest triplet energy level of the compound having an electron transport capability ($T_2$) and the lowest triplet energy level of the organic light emitting compound ($T_H$) satisfy formula (II):

$$T_2-T_H>-0.2 \text{ eV} \qquad \text{formula (II)};$$

wherein that a third functional layer is disposed between the first electrode and the first functional layer, and the third functional layer comprises a hole transport compound having a structure of formula (K-1):

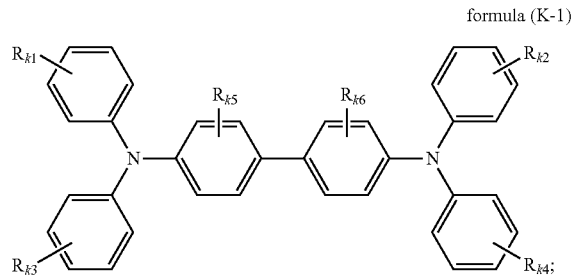

formula (K-1)

and
wherein in formula (K-1), $R_{k1}$, $R_{k2}$, $R_{k3}$, $R_{k4}$, $R_{k5}$, and $R_{k6}$ are each independently any one selected from the group consisting of hydrogen, an unsubstituted phenyl, or a phenyl group having a C1-C6 alkyl substituent; $R_{k5}$ and $R_{k6}$ are each independently any one selected from the group consisting of hydrogen, an unsubstituted C1-C6 alkyl, fluorine or chlorine.

19. The OLED display panel according to claim 18, wherein that the hole transport compound having a structure of formula (K-1) includes

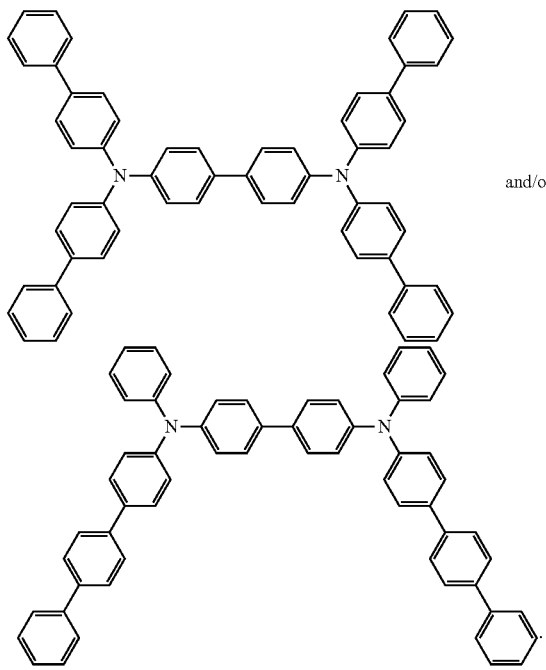

and/or

20. The OLED display panel according to claim 18, wherein two sides of the third functional layer each is independently disposed with an auxiliary functional layer, the auxiliary functional layer includes a hole transport compound having a structure of formula (K-1) and a dopant having a structure of formula (C-1) doped in the hole transport compound having a structure of formula (K-1);

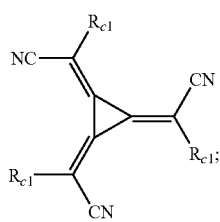

formula (C-1)

wherein in formula (C-1), $R_{C1}$ includes a fluorine-substituted aromatic ring group.

21. The OLED display panel according to claim 20, wherein that the dopant having a structure of formula (C-1) includes

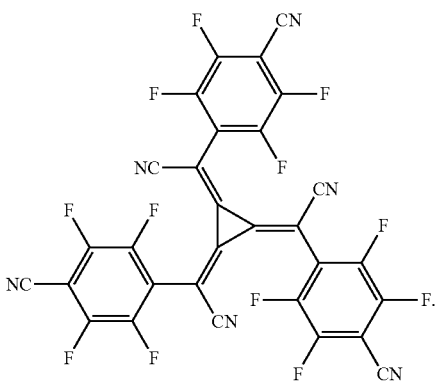 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F]

22. The OLED display panel according to claim 1, wherein the second functional layer comprises a host material having a structure of formula (D-1) and a dopant dispersed in the host material, the dopant comprises a metal and/or a metal compound;

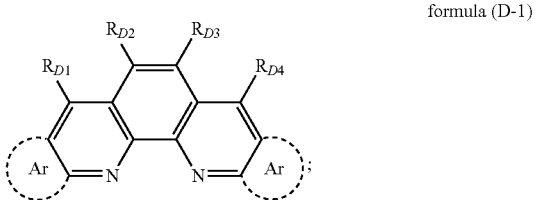

formula (D-1)

wherein in formula (D-1), $R_{D1}$, $R_{D2}$, $R_{D3}$ and $R_{D4}$ are each independently selected from any one of hydrogen, an alkyl group, a substituted or unsubstituted aromatic group; and wherein a metal element in the metal and/or the metal compound includes any one of an alkali metal, an alkaline earth metal and a rare earth metal.

23. The OLED display panel according to claim 22, wherein that the host material having a structure of formula (D-1) includes

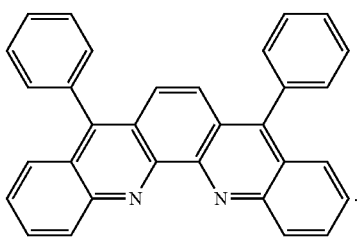 [SMILES: c1ccc(-c2c3ccccc3nc3c2ccc2c(-c4ccccc4)c4ccccc4nc23)cc1]

24. The OLED display panel according to claim 22, wherein that the metal element in the metal and/or the metal compound includes lithium, calcium, ytterbium, or magnesium.

25. The OLED display panel according to claim 22, wherein that the metal element in the metal and/or the metal compound is lithium.

* * * * *